(12) United States Patent
Boutwell et al.

(10) Patent No.: US 9,112,074 B2
(45) Date of Patent: Aug. 18, 2015

(54) UV PHOTODETECTORS HAVING SEMICONDUCTOR METAL OXIDE LAYER

(71) Applicant: University of Central Florida Research Foundation, Inc., Orlando, FL (US)

(72) Inventors: R. Casey Boutwell, Raleigh, NC (US); Ming Wei, Orlando, FL (US); Winston V. Schoenfeld, Oviedo, FL (US)

(73) Assignee: University of Central Florida Research Foundation, Inc., Orlando, FL (US)

( * ) Notice: Subject to any disclaimer, the term of this patent is extended or adjusted under 35 U.S.C. 154(b) by 0 days.

(21) Appl. No.: 14/222,242

(22) Filed: Mar. 21, 2014

(65) Prior Publication Data

US 2014/0284598 A1   Sep. 25, 2014

Related U.S. Application Data

(60) Provisional application No. 61/804,299, filed on Mar. 22, 2013.

(51) Int. Cl.
*H01L 21/00* (2006.01)
*H01L 31/032* (2006.01)
*H01L 31/18* (2006.01)

(52) U.S. Cl.
CPC .............. *H01L 31/032* (2013.01); *H01L 31/18* (2013.01)

(58) Field of Classification Search
CPC ........ H01L 27/14; H01L 31/032; H01L 31/18
USPC ..................... 438/85, 86, 104, 754
See application file for complete search history.

(56) References Cited

U.S. PATENT DOCUMENTS

| | | | |
|---|---|---|---|
| 6,939,731 B2 * | 9/2005 | Ishizaki | 438/22 |
| 8,946,790 B2 * | 2/2015 | Yokoi et al. | 257/288 |
| 2010/0237344 A1 | 9/2010 | Schoenfeld | |
| 2013/0193432 A1 * | 8/2013 | Yamazaki | 257/43 |

* cited by examiner

*Primary Examiner* — Hung Vu
(74) *Attorney, Agent, or Firm* — Jetter & Associates, P.A.

(57) ABSTRACT

A method of forming an ultraviolet (UV) photodetector includes forming an epitaxial semiconductor metal oxide layer on a substrate, wherein the forming includes using an $O_2$ flow rate and applied RF plasma power which together provide a ratio of O• (oxygen radicals) to $O^+$ of at least 1.5. Metal fingers are formed on a surface of the semiconductor metal oxide layer. The metal fingers can include a multi-layer stack including a metal having a 25° C. work function <4 eV positioned between an adhesion layer and an oxidation resistant metal capping layer. The semiconductor metal oxide layer can be $Zn_{1-x}Mg_xO$ wherein $0<x<1$.

9 Claims, 4 Drawing Sheets

UV PHOTODETECTORS HAVING SEMICONDUCTOR METAL OXIDE LAYER

CROSS REFERENCE TO RELATED APPLICATIONS

This application claims the benefit of Provisional Application Ser. No. 61/804,299 entitled "OXIDE SEMICONDUCTING THIN FILMS FOR UV SENSORS", filed Mar. 22, 2013, which is herein incorporated by reference in its entirety.

FIELD

Disclosed embodiments relate to optoelectronic and microelectronic devices and fabrication methods thereof, and to semiconductor metal oxide layers and articles including ultraviolet (UV) photodetectors therefrom.

BACKGROUND

Ultraviolet (UV) photodetectors and light emitters find numerous uses including applications in the defense, commercial, and scientific arenas. These include, for example, covert space-to-space communications, missile threat detection, chemical and biological threat detection and spectroscopy, UV environmental monitoring, and germicidal cleansing. Detectors and light emitters operating in the solar blind region are of special interest. The solar blind region corresponds to the spectral UV region where strong upper atmospheric absorption of solar radiation occurs, generally at wavelengths between about 200 nm and 290 nm. This creates a natural low background window for detection of man-made UV sources on and proximate to the earth's surface.

Semiconductor materials having a 25° C. band gap of about 4 to 6 eV have been used to sense or generate solar blind UV radiation. Conventional approaches have used semiconductor metal oxides such as AlGaN, MgZnO, or BeZnO, which generally have wurtzite (hexagonal) lattice structures. AlGaN is known to suffer from various problems including cracking due to strain, generally high dislocation density, and lattice mismatch (all such effects are generally interrelated). High dislocation density undesirably reduces internal quantum efficiency. The use of wurtzite MgZnO is limited due to phase segregation that occurs for mid-Mg compositions as a result of solid solubility limits and mixed phase regions. BeZnO is a somewhat more promising material, but has experienced doping difficulties, particularly difficulties in obtaining high mobility and stable p-type doping.

SUMMARY

Disclosed embodiments include epitaxial semiconductor metal oxide layers such as $Zn_{1-x}Mg_xO$ (hereafter sometimes referred to as ZnMgO) for applications including UV photodetectors, and new metal contact structures having low work function metal contacts for contacting the metal oxide layer. Example photodetectors including ZnMgO layers were designed, fabricated and tested. Such ZnMgO-based photodetectors have shown operation deeper in the Deep UV (DUV) range ranging from about 150 or 200 nm to 300 nm, as compared to known DUV photodetectors, having a performance similar to known photodetectors at the same wavelength, with a narrower detection capability so that the device is able to differentiate between similar wavelengths with improved precision. For example, rather than a conventional photodetector which detects light in a wavelength range from 200-250 nm, disclosed photodetectors can detect in a wavelength range of 200-220 nm, 220-240 nm, or 240-260 nm, such as shown in FIG. 2 described below, thus exhibiting a narrower detection capability.

Disclosed ZnMgO layers deposited on commercially available substrates such as MgO substrates using a Plasma Enhanced-Molecular Beam Epitaxy (PE-MBE) process have shown to access the DUV range with a photodetector device performance similar to that of AlGaN-based photodetectors. The same or a similar process is also shown capable to produce metal oxide layers that access the near UV (NUV) spectral region up to a wavelength of 400 nm. Disclosed ZnMgO UV photodetectors also exhibit significantly lower dark current, indicating the potential for significantly improved accuracy compared to known AlGaN photodetectors including commercially available AlGaN photodetectors.

DETAILED DESCRIPTION

Figure 1:
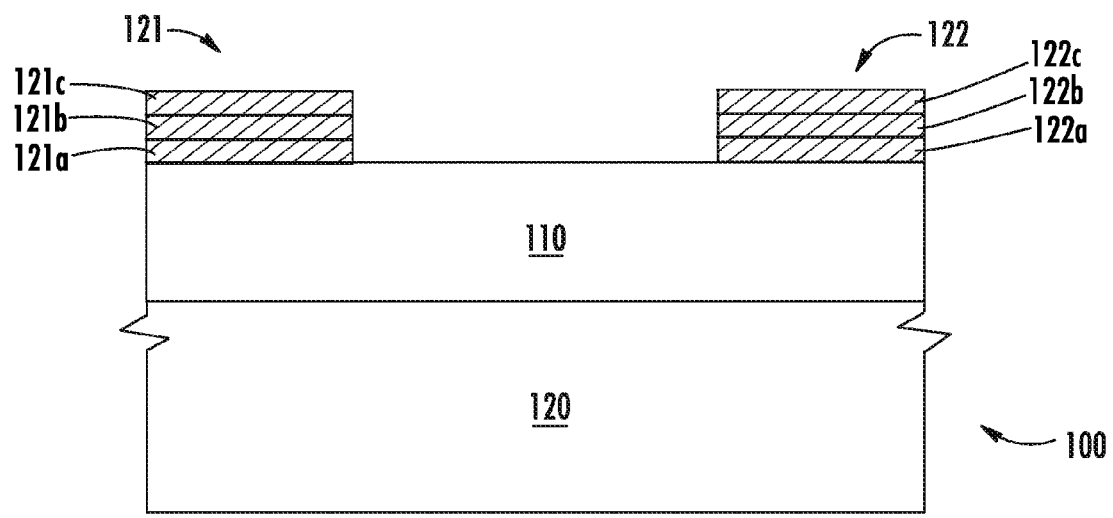
FIG. 1 is a cross sectional depiction of an example photodetector comprising interdigitated metal fingers comprising a multi-layer stack including a low work function metal oppositely laying on the surface of a disclosed semiconductor metal oxide layer, according to an example embodiment.

Disclosed embodiments are described with reference to the attached figures, wherein like reference numerals, are used throughout the figures to designate similar or equivalent elements. The figures are not drawn to scale and they are provided merely to illustrate aspects disclosed herein. Several disclosed aspects are described below with reference to example applications for illustration. It should be understood that numerous specific details, relationships, and methods are set forth to provide a full understanding of the embodiments disclosed herein.

One having ordinary skill in the relevant art, however, will readily recognize that the disclosed embodiments can be practiced without one or more of the specific details or with other methods. In other instances, well-known structures or operations are not shown in detail to avoid obscuring aspects disclosed herein. Disclosed embodiments are not limited by the illustrated ordering of acts or events, as some acts may occur in different orders and/or concurrently with other acts or events. Furthermore, not all illustrated acts or events are required to implement a methodology in accordance with this Disclosure.

Notwithstanding that the numerical ranges and parameters setting forth the broad scope of this Disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

FIG. 1 is a cross sectional depiction of an example photodetector 100 comprising interdigitated metal fingers with metal fingers 121 and 122 shown comprising a multi-layer stack including a low work function metal oppositely laying on the surface of a semiconductor metal oxide layer 110 (hereafter metal oxide layer 110), on a substrate 120, according to an example embodiment. Although the metal oxide layer 110 is generally described herein as being a $Zn_{1-x}Mg_xO$ layer where $0<x<1$, the metal oxide layer 110 may also comprise other metal oxide compounds including NiMgO, as well as other metal oxide compounds comprising transition metals or alkaline earth metals including Ni, Cu, Co, Vn, Mg, and Be, such as NiO, CuO, CoO, MgO, BeO and mixtures thereof.

The photodetector 100 can be a solar-blind photodetector operating in a band between 200 nm and 290 nm, such as between 240 nm and 260 nm in one example. The metal fingers 121 and 122 form low resistance contacts with the metal oxide layer 110 by including a low work function metal. Including a low work function metal for the metal finger contacts with the metal oxide layer 110 is recognized as one factor that may enable the enhanced response (e.g. in Amps/Watt) under illumination provided by disclosed photodetectors compared to a photodetector having the same structure including the same metal oxide layer 110 except having conventional metal finger contacts such as comprising Ni, Ti, or Zn.

The metal fingers 121 and 122 can be formed by deposition followed by photolithography. In a typical embodiment the gaps between the metal finger 121 and 122 are several microns. The substrate 120 comprises a crystalline substrate such as a cubic substrate 120 (e.g., MgO) or other substrate that may or may not offer lattice matching with respect to the metal oxide layer 110 such as, but not limited to, silicon, quartz, and sapphire. The metal fingers 121 and 122 are shown comprising a multi-layer stack including a low work function metal layer 121b, 122b (defined herein as having a 25° C. work function <4 eV, such as Mg) between an adhesion layer 121a, 122a (e.g., a 2 nm to 5 nm Ni or Ti layer) and an oxidation resistant metal capping layer 121c, 122c which can comprise a noble metal such as Au. The low work function metal layer 121b, 122b can be polycrystalline or single crystal, and can be 10 nm to 30 nm thick in one embodiment. The oxidation resistant metal capping layer 121c, 122c can in one embodiment be 60 nm to 100 nm thick.

Regarding disclosed methods, a PE-MBE reactor can be used to grow disclosed metal oxide layers including $Zn_{1-x}Mg_xO$ thin films, and PE-MBE parameters including growth temperature, Mg (or other metal) source flux, oxygen flow rate, and radio-frequency (RF) power coupled into the plasma can be selected to change the composition and level of cystallinity (e.g., fraction of amorphous and crystalline phases) of the metal oxide layer 110. Other epitaxial deposition techniques utilizing plasma assisted growth providing an oxygen plasma source can also be used, including pulsed laser deposition (PLD) and plasma enhanced Chemical Vapor Deposition (PECVD).

Figure 3:
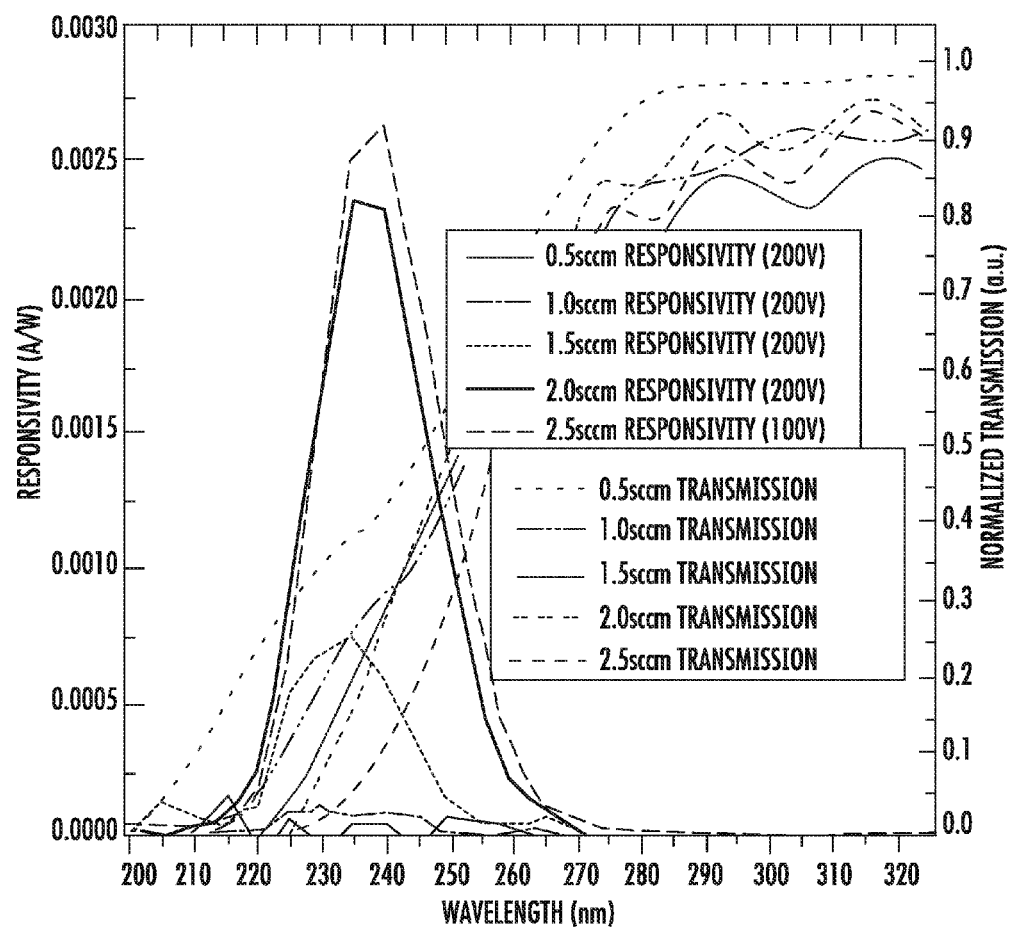
FIG. 3 shows a measured spectral responsivity shift and normalized transmission with varying $O_2$ flow rates for a PE-MBE process, showing tunability and an increase in response intensity as the peak moves closer to 400 nm.

It has been found process conditions can change the metal oxide layer's optical transmission, surface morphology, growth rate, crystalline phase, and stoichiometric composition. Oxygen plasma composition was investigated by spectroscopic analysis under varying $O_2$ flow rates and RF power which were found to significantly influence photodetector performance (see FIG. 3 described below). Ni/Mg/Au interdigitated metal fingered photodetectors having a $Zn_{1-x}Mg_xO$ layer on a cubic MgO substrate were formed to measure spectral responsivity and the UV-Visible rejection ratio (RR).

PE-MBE fabricated $Zn_{1-x}Mg_xO$ layers ranged in Mg composition from x=0.45 to 1.0. Generally, x was found to increase with increasing substrate temperature and Mg source flux, and decrease with increasing oxygen flow rate and RF power. Increasing x was correlated with decreased response intensity and increased RR. Typical PE-MBE process parameter ranges include a substrate temperature from 100° C. to 750° C., a Mg source operated at 300° C. to 460° C., an oxygen flow rate from 0.5 standard cubic centimeters per minute (sccm) to 5.0 sccm, and an RF plasma power from 50 W to 600 W.

Photodetector device performance including responsivity was found to be significantly enhanced by increasing the ratio of O• (oxygen radicals) to $O^+$ to at least 1.5 and minimizing $O^{2+}$ in the plasma to be less than $O^+$ which was found to be controllable using the PE-MBE process parameters of $O_2$ flow rate and applied RF plasma power. Increasing the ratio of O• to $O^+$ to at least 1.5 and minimizing $O^{2+}$ in the plasma to be less than $O^+$ was found to enhance the surface kinetics of the growth and etching behavior of the plasma during PE-MBE growth of the ZnMgO layer.

Relative ratios between $O^+$ and $O^{2+}$ are typically at least 4:1, such as at least 10:1. Although O• during PE-MBE processing cannot be measured based on conventional light emission because only ionized atoms emit light when relaxing to their ground (neutral) state, the ratio of O• to $O^+$ was estimated as being at least 1.5. Specific choices for $O_2$ flow rate and applied RF plasma power can be selected to provide a beneficial mix of O• to $O^+$ at least 1.5. This minimum ratio of O• to $O^+$ of higher ratio can result in enhanced incorporation of O into the growing epitaxial metal oxide crystal at the same time that O• is etching away the loosely-bound deposited metal "ad-atoms." This arrangement provides the effect of a net positive growth with an etching effect "scrubbing" the surface of weakly-bound (not lowest-energy-state) metal atoms that would otherwise lead to defects in the growing metal oxide crystal which would otherwise reduce photodetector responsivity.

Responsivity as high as 500 A/W was observed in the solar-blind for disclosed $Zn_{1-x}Mg_xO$ photodetector devices. Cubic phase solar-blind sensing $Zn_{1-x}Mg_xO$ devices demonstrated a peak responsivity as high as 12.6 mA/W at 235 nm.

It has also been found that by raising the Zn concentration to at least 10 to 20 at. % of the overall $Zn_{1-x}Mg_xO$ composition, such as by increasing the $O_2$ flow rate to around 2.5 sccm (the flow being dependent on the individual PE-MBE machine design and geometry employed), RF power of about 375 W (power being dependent on the specific PE-MBE machine), or decreasing the deposition temperature to around 300° C., disclosed ZnMgO layers can provide a mixed phase, including local regions of both cubic and wurtzite phases. The mixed phase can range from 0.001 wt. % wurtzite to 60 wt. % wurtzite, with a typical mixed phase ranging from 3 wt. % to 20 wt. % wurtzite. Photodetectors made with mixed phase ZnMgO have been unexpectedly found to provide a broadband response (e.g., from the near ultraviolet as high as 400 nm down to the deep ultraviolet as low as 200 nm, shown in FIG. 4. described below), which can be filtered if desired to provide a desired narrower photodetector response.

EXAMPLES

Disclosed embodiments of the invention are further illustrated by the following specific Examples, which should not be construed as limiting the scope or content of this Disclosure in any way. For example, although the metal oxide layer is described as being ZnMgO, as noted above the metal oxide layer may also comprise ZnBeO, or transition or alkaline earth metals including Ni, Cu, Co, and Vn.

A PE-MBE reactor was used for all examples. The substrate used was cubic MgO. A high Mg concentration such as around at least 60% and relatively low substrate temperature of 200° C. to around 450° C. during PE-MBE formation of the ZnMgO layer was used. The RF plasma power was about 375 W. In this example, the resulting epitaxial ZnMgO film was in a thickess range generally between 80 nm and 600 nm, and was found to exhibit a uniform cubic crystal structure.

Figure 2:
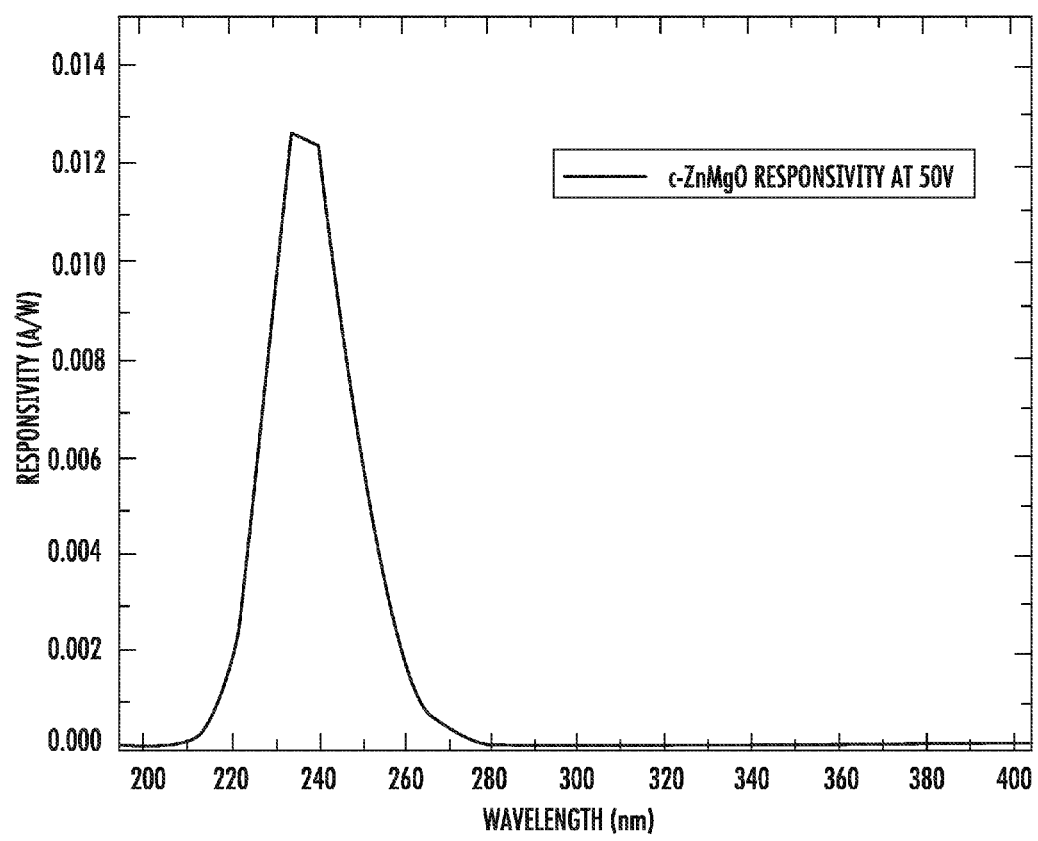
FIG. 2 is a measured spectral response for an example disclosed DUV cubic ZnMgO (c-ZnMgO) photodetector showing a narrow detector response of about 20 nm.

Photodetector operation was found to be limited to a narrow range of the DUV, typically 20 nm wide, such as 200-220 nm, 220-240 nm, or 240-260 nm, thus exhibiting a narrow detection range capability. Higher voltage compared to conventional photodetector testing was applied during photodetector measurements being generally between 50 V and 200V. However, the maximum voltage applied generally depends on the photodetector geometry (closer electrode spacing has lower applied voltage) as compared to under about 5 V for conventional AlGaN photodetectors. An example of DUV operation for a disclosed c-ZnMgO photodetector is shown in FIG. 2 operated at 50 V which evidences narrow detection range (width) capability of about 20 nm at about 0.006 A/W being measured at ½ the response peak.

The width and position of the response peak was found to be tunable depending on the ZnMgO layer PE-MBE formation conditions. Spectral responsivity was found to decrease as the peak moves deeper in to the UV (towards 200 nm), and increase as it moves towards the visible (towards 400 nm). As disclosed above, the photodetector's performance has also been found to be impacted by growth temperature, level of Mg/Zn incorporation, $O_2$ flow into the chamber, and the RF energy used to excite the $O_2$ into plasma products. This photodetector' responsivity shift is shown for the example of changing $O_2$ flow rates in FIG. 3 from 0.5 sccm to 2.5 sccm which also includes a normalized transmission plot which measures the amount of light passing through the device. To normalize the data, the Applicants divided each curve by its peak value, thereby "normalizing" all curves to a maximum value of 1 (peak#/peak#=1 for all curves). This allows comparing the shape of the curves, rather than just their intensities. Responsivity is seen to range from about 0.0001 A/W for $O_2$ flows of 0.5 and 1 sccm, while the responsivity is shown jumping by a factor of at least 20 to 0.0023 or more for $O_2$ flows of 2.0 and 2.5 sccm.

Figure 4:
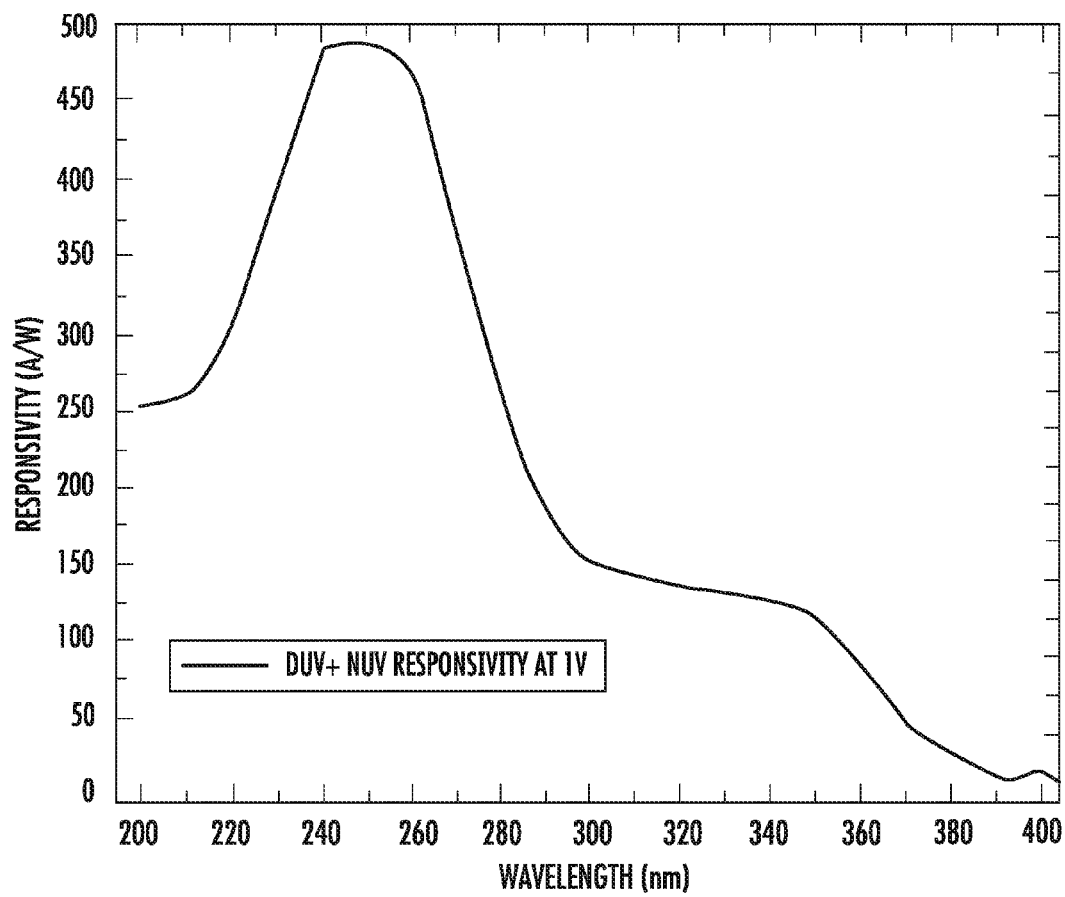
FIG. 4 shows an example broad DUV+NUV visible-blind response obtained from a disclosed photodetector having a disclosed ZnMgO metal oxide layer.

Regarding NUV operation defined as from 300 nm to 400 nm, NUV operation includes DUV detection as well, making the fabricated photodetectors effectively visible-blind. While the detection range is much wider (i.e. less precise), the photodetector' response is significantly higher (e.g., $10^3$ to $10^5$ times) as compared to DUV ZnMgO performance. This has been found to occur when Zn incorporation is sufficiently high such as over 35 atomic %, corresponding to x<0.65, resulting in multiple different crystal structures present in the ZnMgO layer (e.g., cubic and wurtzite). This significantly increased responsivity of disclosed detectors enables enhanced operation in the DUV as well. Disclosed metal oxide layers providing broad but strong response through the NUV can function exclusively as DUV photodetectors through the use of NUV filters. Such filters can exclude detection of NUV light, while maintaining a high intensity response in the DUV range. A broad DUV+NUV response at 1 V is shown in FIG. 4. The NUV+DUV spectral responsivity shows a broad visible-blind operation. As noted above, NUV filtering can be used to provide a more intense DUV response.

While various disclosed embodiments have been described above, it should be understood that they have been presented by way of example only, and not as a limitation. Numerous changes to the disclosed embodiments can be made in accordance with the Disclosure herein without departing from the spirit or scope of this Disclosure. Thus, the breadth and scope of this Disclosure should not be limited by any of the above-described embodiments. Rather, the scope of this Disclosure should be defined in accordance with the following claims and their equivalents.

Although disclosed embodiments have been illustrated and described with respect to one or more implementations, equivalent alterations and modifications will occur to others skilled in the art upon the reading and understanding of this specification and the annexed drawings. While a particular feature may have been disclosed with respect to only one of several implementations, such a feature may be combined with one or more other features of the other implementations as may be desired and advantageous for any given or particular application.

The invention claimed is:

1. A method of forming an ultraviolet (UV) photodetector, comprising:
   forming an epitaxial semiconductor metal oxide layer on a substrate, wherein said forming comprises using an $O_2$ flow rate and applied RF plasma power which together provide a ratio of O• (oxygen radicals) to $O^+$ of at least 1.5, and
   forming metal fingers on a surface of said semiconductor metal oxide layer.

2. The method of claim 1, wherein said forming said metal fingers comprises forming a multi-layer stack including a metal having a 25° C. work function <4 eV positioned between an adhesion layer and an oxidation resistant metal capping layer.

3. The method of claim 2, wherein said metal having a 25° C. work function <4 eV comprises Mg.

4. The method of claim 1, wherein said semiconductor metal oxide layer comprises $Zn_{1-x}Mg_xO$ wherein 0<x<1.

5. The method of claim 4, wherein said substrate has a cubic structure and said $Zn_{1-x}Mg_xO$ includes a cubic structure.

6. The method of claim 5, wherein said substrate comprises MgO.

7. The method of claim 5, wherein said forming said epitaxial semiconductor metal oxide layer comprises a Plasma Enhanced-Molecular Beam Epitaxy (PE-MBE) process.

8. The method of claim 4, wherein 0<x <0.65 and said $Zn_{1-x}Mg_xO$ includes local regions of both cubic phases having said cubic structure and wurtzite phases having a wurtzite structure.

9. The method of claim 8, wherein said wurtzite phases provide 3 wt. % to 50 wt. % of said $Zn_{1-x}Mg_xO$.

* * * * *